United States Patent
Hyde et al.

(10) Patent No.: US 7,541,843 B1
(45) Date of Patent: Jun. 2, 2009

(54) SEMI-STATIC FLIP-FLOPS FOR RFID TAGS

(75) Inventors: John D. Hyde, Corvallis, OR (US);
Dennis Kiyoshi Hara, Bellevue, WA (US); David D. Dressler, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 522 days.

(21) Appl. No.: 11/490,671

(22) Filed: Jul. 20, 2006

Related U.S. Application Data

(63) Continuation-in-part of application No. 11/388,235, filed on Mar. 22, 2006.

(60) Provisional application No. 60/774,902, filed on Feb. 16, 2006.

(51) Int. Cl.
*H03K 3/037* (2006.01)
*G06K 19/06* (2006.01)

(52) U.S. Cl. .................. 326/105; 340/572.1; 235/492

(58) Field of Classification Search .............. 326/105; 340/572.4, 572.1, 5.65; 235/492
See application file for complete search history.

(56) References Cited

U.S. PATENT DOCUMENTS

| 4,227,097 A | 10/1980 | Piguet | |
| 2003/0141913 A1* | 7/2003 | Park et al. | 327/218 |
| 2003/0183699 A1* | 10/2003 | Masui | 235/492 |

OTHER PUBLICATIONS

Yuan, Jiren and Svensson, Christer; New Single-Clock CMOS Latches and Flipflops with Improved Speed and Power Savings; IEEE Journal of Solid-State Circuits, Jan. 1997, pp. 62-69, vol. 32, No. 1.
Yuan, Jiren, et al., "New Single-Clock CMOS Latches and Flipflops with Improved Speed and Power Savings", *IEEE Journal of Solid-State Circuits*, 32(1), (Jan. 1997),62-69.

* cited by examiner

*Primary Examiner*—Daniel D Chang
(74) *Attorney, Agent, or Firm*—Turk IP Law

(57) ABSTRACT

A radio frequency identification (RFID) circuit including a semi-static flip-flop having a static storage time longer than its dynamic storage time. The RFID circuit may include a timing block circuit to provide a timing block clock signal to the semi-static flip-flop, the signal having a first clock state duration shorter than the dynamic storage time and a second clock state duration longer than the dynamic storage time.

30 Claims, 9 Drawing Sheets

RFID TAG CIRCUIT
WITH SEMI-STATIC FLIP-FLOP

*RFID SYSTEM*

*RFID TAG*

*RFID TAG COMPONENTS*

SIGNAL PATH DURING R→T

SIGNAL PATH DURING T→R

*DIGITAL TAG CONTROLLER DISTRIBUTING TIMING SIGNAL*

*HIGH FREQUENCY TIMING SIGNAL*

*RFID TAG CIRCUIT  
WITH SEMI-STATIC FLIP-FLOP*

*GENERAL FLIP-FLOP WAVEFORMS*

*RFID TAG CIRCUIT
WITH SEMI-STATIC FLIP-FLOP*

*WAVEFORM TIMING*

*RFID TAG CIRCUIT WITH SEMI-STATIC FLIP-FLOPS*

WAVEFORM TIMING

SEMI-STATIC FLIP-FLOPS FOR RFID TAGS

This application is a continuation in part of U.S. application Ser. No. 11/388,235 filed on Mar. 22, 2006, entitled "ERROR RECOVERY IN RFID READER SYSTEMS".

RELATED APPLICATIONS

This patent application claims the benefit of the filing date of U.S. Provisional Patent Application Ser. No. 60/774,902, filed on Feb. 16, 2006 and titled, "Narrow Pulse, Symbol Rate Clocking With Semi-Static Flip-Flops For RFID Tags," which is incorporated herein by reference in its entirety.

TECHNICAL FIELD

The present description addresses the field of Radio Frequency IDentification (RFID) systems, including clocking apparatus, systems, and methods applied to RFID circuitry.

BACKGROUND INFORMATION

RFID systems may include RFID tags and RFID readers (the latter may also be known as RFID reader/writers or RFID interrogators). RFID systems can be used in many ways, including locating and identifying objects to which the tags are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response may be demodulated and decoded by the reader, which thereby identifies, counts, or otherwise interacts with the associated item. The decoded data can denote a serial number, a price, a date, a destination, other attribute(s), any combination of attributes, and so on.

An RFID tag typically includes an antenna system, a power management section, a radio section, and frequently a logic section, a memory, or both. In earlier RFID tags, the power management section included an energy storage device, such as a battery. RFID tags with such an energy storage device are known as active tags. Advances in semiconductor technology have miniaturized the electronics so much that many RFID tags can be powered solely by the received RF signal. Such RFID tags do not include an energy storage device, and are called passive tags.

As technology continues to advance, customers have focused on the desire to reduce power usage, as well as producing an increased number of devices using the same wafer size. Thus, there is a need for RFID circuitry, including circuitry used in RFID tags, that uses less power, and less die real estate.

DETAILED DESCRIPTION

The challenges noted above may be addressed in some of the embodiments disclosed herein by providing an RFID circuit including one or more semi-static flip-flops having static storage times longer than their dynamic storage times. The RFID circuit, or an RFID tag, may include a timing block circuit to provide a timing block clock signal to some of the semi-static flip-flops, the signal having a first clock state duration shorter than the dynamic storage time and a second clock state duration longer than the dynamic storage time.

Figure 1:
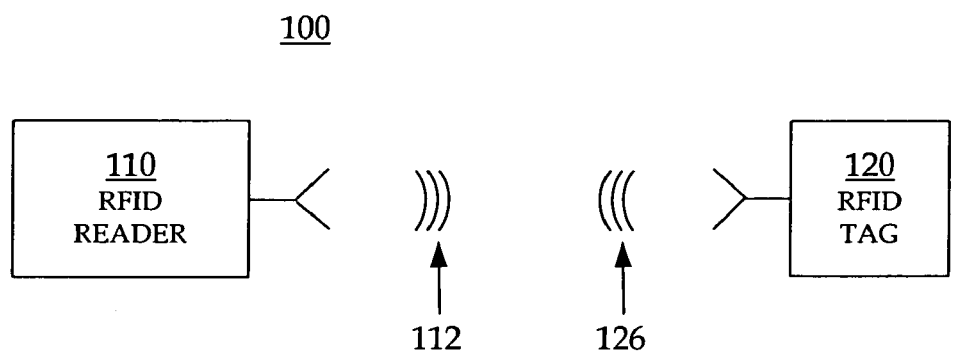
FIG. 1 is a block diagram of components of an RFID system, according to various embodiments of the invention.

FIG. 1 is a block diagram of components of an RFID system 100, according to various embodiments of the invention. An RFID reader 110 transmits an interrogating Radio Frequency (RF) wave 112. The RFID tag 120 in the vicinity of the RFID reader 110 may sense the interrogating RF wave 112, and generate a wave 126 (e.g., via direct transmission or backscatter) in response. The RFID reader 110 may then sense and interpret the wave 126.

Reader 110 and tag 120 may exchange data via the wave 112 and the wave 126. In a session of such an exchange, each may encode, modulate, and transmit data to the other, and each may receive, demodulate, and decode data from the other. The data is modulated onto, and decoded from, RF waveforms 112, 126.

Encoding the data in waveforms can be performed in a number of different ways. For example, protocols may be devised to communicate in terms of symbols, also called RFID symbols. A symbol for communicating may comprise a delimiter, a calibration symbol, and so on. Additional symbols can be implemented for ultimately exchanging binary data, such as "0" and "1", if that is desired. In turn, when the waveforms are processed internally by the reader 110 and the tag 120, they can be equivalently considered and treated as numbers having corresponding values.

The tag 120 can be a passive tag or an active tag, i.e. having its own power source. Where tag 120 is a passive tag, it may be powered from wave 112.

Figure 2:
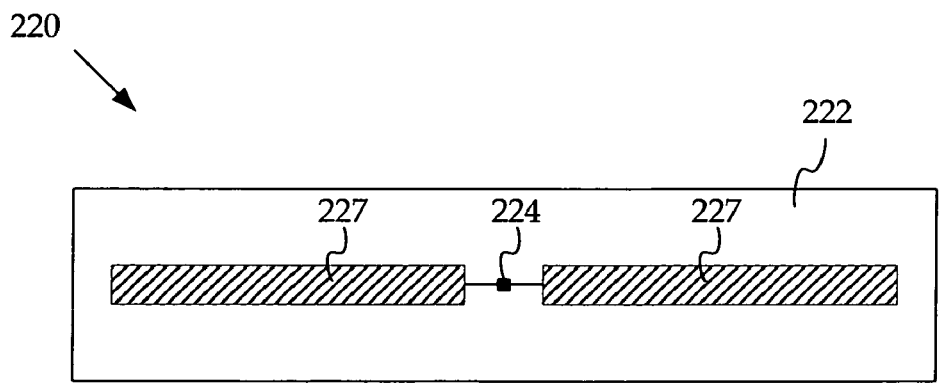
FIG. 2 is a diagram showing components of a passive RFID tag, including a tag that can be used in the system of FIG. 1, according to various embodiments of the invention.

FIG. 2 is a diagram of an RFID tag 220, which can be the same as tag 120 of FIG. 1. Tag 220 is implemented as a passive tag, meaning it does not have its own power source. Much of what is described in this document, however, applies also to active tags.

Tag 220 is formed on a substantially planar inlay 222, which can be made in many ways known in the art. Tag 220 includes an electrical circuit, which is preferably implemented in an integrated circuit (IC) 224. IC 224 is arranged on inlay 222.

Tag 220 also includes an antenna for exchanging wireless signals with its environment. The antenna is usually flat and attached to inlay 222. IC 224 is electrically coupled to the antenna via suitable antenna ports (not shown in this figure).

The antenna may be made in a number of ways, as is well known in the art. In the example of FIG. 2, the antenna is made from two distinct antenna segments 227, which are shown here forming a dipole. Many other embodiments are possible, using any number of antenna segments.

In some embodiments, an antenna can be made with even a single segment. Different places of the segment can be coupled to one or more of the antenna ports of IC 224. For example, the antenna can form a single loop, with its ends coupled to the ports. When the single segment has more complex shapes, it should be remembered that at, the frequencies of RFID wireless communication, even a single segment could behave like multiple segments.

In operation, a signal is received by the antenna, and communicated to IC 224. IC 224 both harvests power, and responds if appropriate, based on the incoming signal and its internal state. In order to respond by replying, IC 224 modulates the reflectance of the antenna, which generates the backscatter from a wave transmitted by the reader. Coupling together and uncoupling the antenna ports of IC 224 can modulate the reflectance, as can a variety of other means.

In the embodiment of FIG. 2, antenna segments 227 are separate from IC 224. In other embodiments, antenna segments may alternately be formed on IC 224, and so on.

The components of the RFID system of FIG. 1 may communicate with each other in any number of modes. One such mode is called full duplex. Another such mode is called half-duplex, and is described below.

Figure 3:
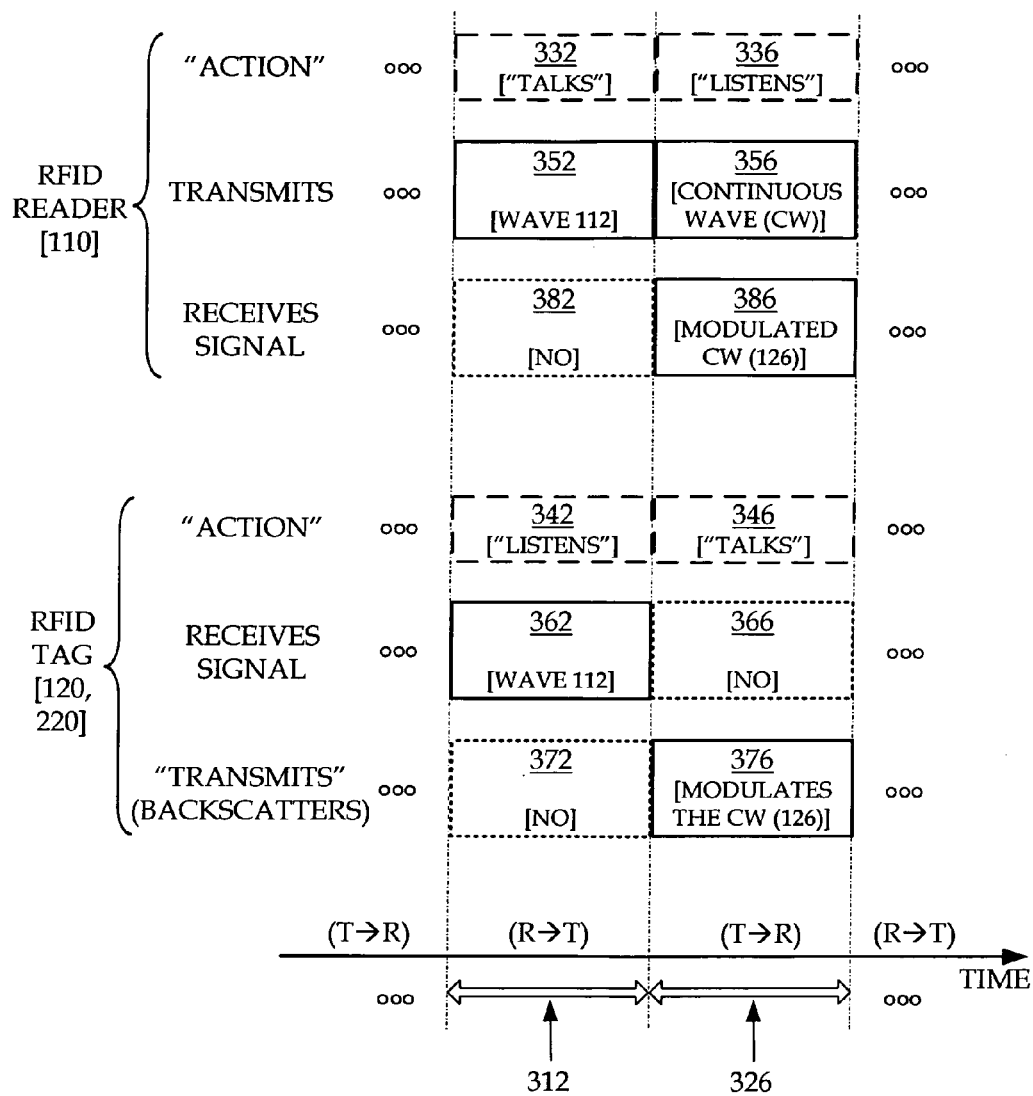
FIG. 3 is a conceptual diagram illustrating a half-duplex mode of communication between the components of the RFID system of FIG. 1, according to various embodiments of the invention.

FIG. 3 is a conceptual diagram 300 illustrating a half-duplex mode of communication between the components of the RFID system 100 of FIG. 1, according to various embodiments of the invention, including when the tag 120 is implemented as a passive tag 220 of FIG. 2. The following explanation is made with reference to a TIME axis, and also to a human metaphor of "talking" and "listening". The actual technical implementations for "talking" and "listening" are now described.

The RFID reader 110 and RFID tag 120 talk and listen to each other by taking turns. As seen on the axis TIME, when the reader 110 talks to the tag 120, the communication session is designated as "R→T", and when the tag 120 talks to the reader 110, the communication session is designated as "T→R". Along the TIME axis, a sample R→T communication session may occur during a time interval 312, and a follow-on sample T→R communication session may occur during a time interval 326. Of course, the intervals 312, 326 can be of different durations—here the durations are shown approximately equal only for purposes of illustration, and the various embodiments are not to be so limited.

According to blocks 332 and 336, the RFID reader 110 talks during interval 312, and listens during interval 326. According to blocks 342 and 346, the RFID tag 120 listens while reader 110 talks (during interval 312), and talks while the reader 110 listens (during interval 326).

In terms of actual technical behavior, during the interval 312, the reader 110 talks to the tag 120 as follows. According to block 352, the reader 110 transmits the wave 112, which was first described in FIG. 1. After a relatively short delay determined by the wave 112 propagation time from the reader 110 to the tag 120, according to block 362, the tag 120 receives the wave 112 and processes it as required. Meanwhile, according to block 372, the tag 120 does not operate to backscatter the wave 112 with its antenna, and according to block 382, the reader 110 therefore has no wave 126 to receive from tag 120.

During the interval 326, the tag 120 talks to the reader 110 as follows. According to block 356, the reader 110 transmits a signal, which may comprise a continuous wave (CW) signal, which can be thought of as a carrier signal that ideally encodes no information. As discussed before, this carrier signal may serve both to be harvested by tag 120 for its own internal power needs, and also as a wave that tag 120 can backscatter. Indeed, during interval 326, according to block 366, the tag 120 does not receive a signal for processing. Instead, according to block 376, the tag 120 operates to modulate the CW signal emitted according to block 356, so as to generate a backscatter wave 126. Thereafter, according to block 386, reader 110 receives backscatter wave 126 and processes it.

In some embodiments, an RFID reader/interrogator may communicate with one or more RFID tags in any number of ways. Some of these ways are called protocols. A protocol is a specification that calls for a specific manner of signaling between the reader and the tags. For example, one such protocol is entitled "EPC™ Radio-Frequency Identity Protocols Class-1 Generation-2 UHF RFID Protocol for Communications at 860 MHz-960 MHz," EPCu Global Inc., Version 1.0.9, January 2005, and is incorporated herein by reference in its entirety. This protocol is also colloquially known as "the Gen2 Spec".

It has been described above how the reader 110 and the tag 120 may communicate in terms of time. In addition, communications between the reader 110 and the tag 120 may be described in terms of frequency. For example, frequency restrictions may be imposed so that the available frequency spectrum is partitioned into divisions that are called channels. Different partitioning schemes may be specified by the various regulatory jurisdictions and authorities (e.g., the Federal Communications Commission (FCC) in North America, the Conference Européenne des Administrations des Postes et des Telecommunications (CEPT) in Europe, etc.).

The reader 110 may transmit using a transmission spectrum that lies within one channel, or using multiple channels. In some regulatory jurisdictions the authorities permit aggregating multiple channels into one or more larger channels, but for all practical purposes an aggregate channel can again be considered a single, albeit larger, individual channel.

Tag 120 can respond with a backscatter signal 126 that is modulated directly onto the frequency of the reader's emitted CW signal 112, sometimes called baseband backscatter. Alternatively, the tag 120 can respond with a backscatter signal 126 that is modulated onto a frequency, developed by the tag 120, that is different from the reader's emitted CW signal 112, and this modulated tag frequency may then be impressed upon the reader's emitted CW signal 112. This second type of backscatter operation is sometimes called subcarrier backscatter. The subcarrier frequency can be within the reader's channel, can straddle the boundaries of the reader's channel and an adjacent channel, or can be wholly outside the reader's channel.

A number of jurisdictions require a reader to hop to a new channel on a regular basis. When a reader hops to a new channel it may encounter interfering RF energy.

Some embodiments of the invention can be useful in different RFID environments, for example, in the deployment of RFID readers in sparse- or dense-reader environments, in environments with networked and disconnected readers (e.g., where a hand-held reader may enter a field of networked readers), in environments with mobile readers, and in environments with other interference sources. Thus, it is to be understood that the embodiments described herein are not limited to operation in the above environments, but may provide improved operation in such environments.

Figure 4:
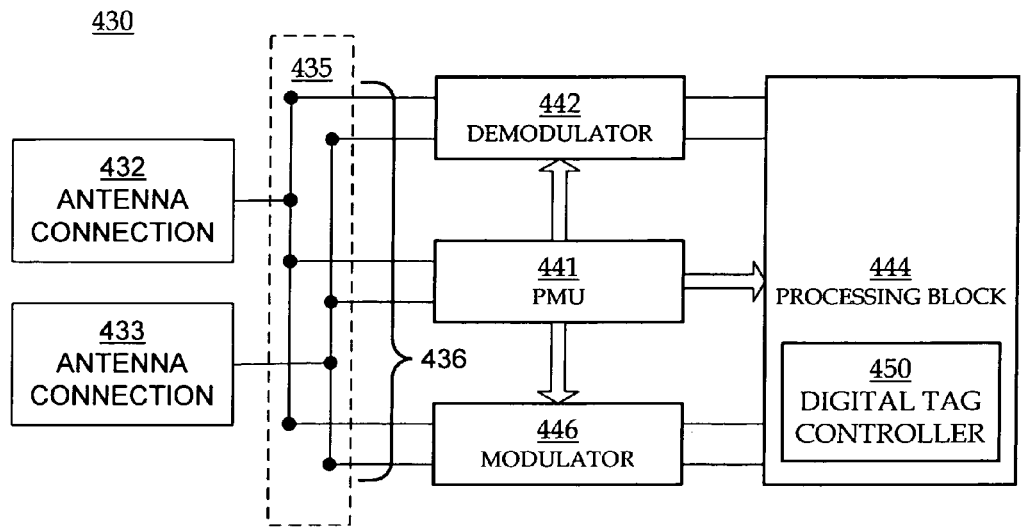
FIG. 4 is a block diagram of an electrical circuit formed as an integrated circuit included in the tag of FIG. 2, according to various embodiments of the invention.

FIG. 4 is a block diagram of an electrical circuit 430 formed as an integrated circuit included in the tag of FIG. 2, according to various embodiments of the invention. The circuit 430 may be formed in an IC of an RFID tag, such as IC 224 of FIG. 2. The circuit 430 may have a number of components that are described in this document. The circuit 430 may also have a number of additional components from what is shown and described in FIG. 4, or different components, depending on the particular implementation.

The circuit 430 includes at least two antenna connections 432, 433, which are suitable for coupling to one or more antenna segments (not shown in FIG. 4, but may be similar to or identical to antenna segments 227 of FIG. 2). Antenna connections 432, 433 may be made in any suitable way, perhaps comprising pads, and so on. In a number of embodiments more than two antenna connections are used, generally in embodiments where more antenna segments are used.

The circuit 430 may include a section 435, which may be implemented as a group of nodes 436 for routing signals. In some embodiments, the section 435 may be implemented otherwise, for example to include one or more receive/transmit switches that can route signals, and so on.

The circuit 430 also includes a power management unit (PMU) 441. The PMU 441 may be implemented in any way known in the art, for harvesting raw RF power received via the antenna connections 432, 433. In some embodiments, the PMU 441 includes at least one rectifier, and so on.

In operation, an RF wave received via the antenna connections 432, 433 is received by the PMU 441, which in turn generates power for various components of the circuit 430. This is true for either or both R→T and T→R sessions, whether or not the received RF wave is modulated.

The circuit 430 additionally includes a demodulator 442 that operates to demodulate an RF signal received via the antenna connections 432, 433. The demodulator 442 may be implemented in any way known in the art, for example, including an attenuator stage, an amplifier stage, and so on.

The circuit 430 further includes a processing block 444 that operates to receive the demodulated signal from the demodulator 442, and may perform operations on the information obtained from the demodulated signal. In addition, it may generate an output signal for transmission.

The processing block 444 may be implemented in any way known in the art. In some embodiments, the processing block 444 includes a digital tag controller 450, which is described in more detail below. In some embodiments, the processing block 444 may include a number of components such as a memory, a decoder, an encoder, and so on.

The circuit 430 additionally includes a modulator 446 that operates to modulate an output signal generated by the processing block 444. The modulated signal may be transmitted by driving the antenna connections 432, 433, thereby driving the load presented by the subsequently coupled antenna segment or segments. The modulator 446 may be implemented in any way known in the art, for example, including a driver stage, an amplifier stage, and so on.

In some embodiments, the demodulator 442 and the modulator 446 may be combined in a single transceiver circuit. In some embodiments, the modulator 446 may include a backscatter transmitter or an active transmitter. In yet other embodiments, the demodulator 442 and the modulator 446 may form part of the processing block 444.

It will be recognized at this juncture that the circuit 430 can also comprise a portion of an RFID reader according to the invention, without needing the PMU 441. Indeed, an RFID reader can be powered differently, such as from a wall outlet, a battery, and so on. Additionally, when the circuit 430 is configured as a reader, the processing block 444 may have additional inputs/outputs (I/Os) to a terminal, network, and other such devices or connections.

In terms of processing a signal, the circuit 430 operates differently during a R→T session and a T→R session. The different operations are described below.

Figure 5A:
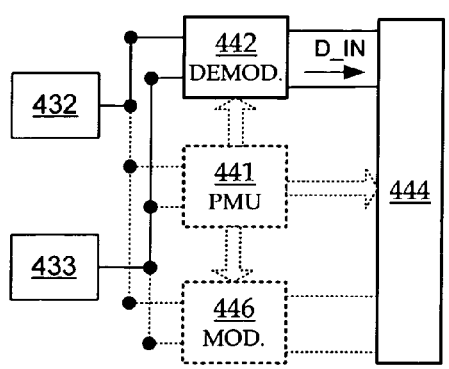
FIG. 5A is the block diagram of FIG. 4, modified to emphasize signal operation during a Reader-to-Tag (R→T) session of FIG. 3, according to various embodiments of the invention.

FIG. 5A shows version 530-A of circuit 430 of FIG. 4. Version 530-A shows the components of circuit 430 for a tag, operating to emphasize a signal operation during a R→T session (in a receive mode of operation) during time interval 312 of FIG. 3. In this case, an RF wave may be received at the antenna connections 432, 433, from which a signal is demodulated using demodulator 442, and then input to a processing block 444 as the signal D_IN. In some embodiments of the invention, the signal D_IN may include a received stream of symbols.

Version 530-A shows in dashed outline those components that do not play a part in processing a signal during a R→T session. Indeed, in some embodiments the PMU 441 may be active, but only in converting raw RF power. And the modulator 446 generally does not transmit during a R→T session. The modulator 446 typically does not interact with the received RF wave significantly, either because switching action in section 435 of FIG. 4 decouples the modulator 446 from the incoming RF wave, or by designing the modulator 446 to have a suitable impedance, and so on.

While the modulator 446 is typically inactive during a R→T session, it need not be always the case. For example, during a R→T session, the modulator 446 may be active in other ways. For example, it may be adjusting its own (internal) parameters for operation in a future session.

Figure 5B:
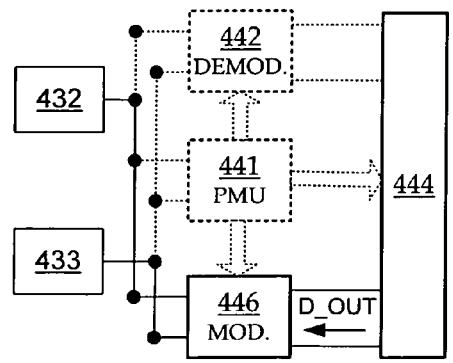
FIG. 5B is the block diagram of FIG. 4, modified to emphasize a signal operation during a Tag-to-Reader (T→R) session of FIG. 3, according to various embodiments of the invention.

FIG. 5B shows version 530-B of circuit 430 of FIG. 4. Version 530-B shows the components of circuit 430 for a tag, operating to emphasize a signal operation during a T→R session (in a transmit mode of operation) during time interval 326 of FIG. 3. A signal may be output from processing block 444 as signal D_OUT. In some embodiments of the invention, the signal D_OUT may include a transmission stream of symbols. The signal D_OUT may be modulated by the modulator 446, and output as an RF wave via the antenna connections 432, 433.

Version 530-B shows in dashed outline those components that do not usually play a part in processing a signal during a T→R session. Indeed, the PMU 441 may be active, but only in converting raw RF power. And the demodulator 442 generally does not receive during a T→R session. The demodulator 442 typically does not interact with the transmitted RF wave, either because switching action in section 435 of FIG.

4 decouples the demodulator 442 from the RF wave, or by designing the demodulator 442 to have a suitable impedance, and so on.

While the demodulator 442 is typically inactive during a T→R session, it need not be always the case. For example, during a T→R session, the demodulator 442 may be active in other ways. For example, it may be adjusting its own (internal) parameters for operation in a future session.

Figure 6A:
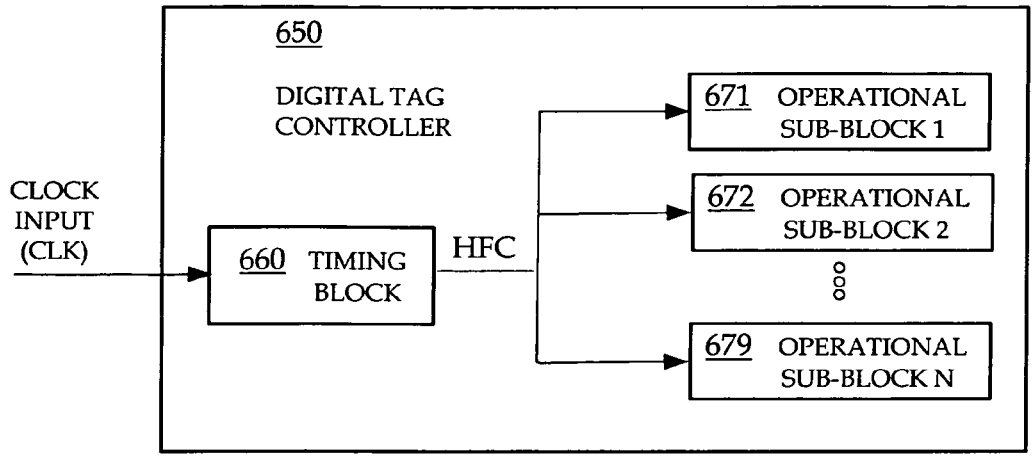
FIGS. 6A and 6B are prior art block diagrams of a tag controller and a representation of a prior art sub-block clock waveform, respectively.
Figure 6B:
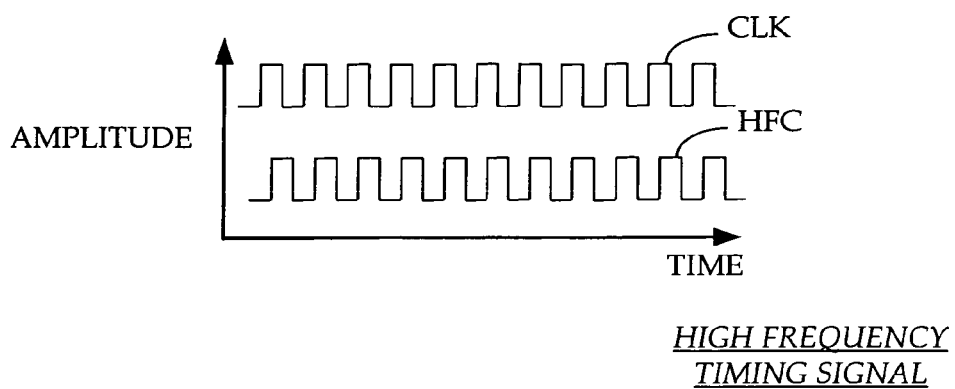

FIGS. 6A and 6B are prior art block diagrams of a tag controller 650 and a representation of a prior art sub-block clock waveform HFC, respectively. The tag controller 650 may include a variety of operational sub-blocks 671, 672, ..., 679, which in turn may each include a variety of components, such as modems, command decoders, state machines, memory interfaces, and circuits to implement additional digital functions.

The timing block 660 may receive a master clock input CLK, and pass on a high frequency clock HFC to the operational sub-blocks 671, 672, ..., 679. Typically, the input data to the sub-blocks 671, 672, ..., 679 is ignored, except at the active clock edge, where the input data may be transferred via flip-flops included in the operational sub-blocks 671, 672, ..., 679 on the active clock edge, which may be either rising or falling. If static flip-flops are used, the time the clock HFC is high (e.g., Tclock_high) and the time the clock HFC is low (e.g., Tclock_low) may be arbitrarily long. Static-flip flops may have higher die area and power consumption than dynamic flip-flops. If dynamic flip-flops are used, the times Tclock_high and Tclock_low may both have limitations on their maximum duration, because the logic state of a dynamic flip-flop is stored as charge on one or more capacitors. Charge leakage from these capacitors may change the flip-flop state if either Tclock_high or Tclock_low exceed the dynamic storage time of the flip-flop. Dynamic flip-flops may provide lower die area use and lower power consumption than static flip-flops.

High frequency, synchronous clocking is the industry standard digital design approach, such that all sub-blocks 671, 672, ..., 679 and included flip-flops receive the same high frequency clock HFC. When this occurs, all internal signals change state synchronously. Use of the high frequency clock HFC permits the use of dynamic flip-flops, but may result in high power consumption, reducing RFID tag sensitivity and range.

Figure 7A:
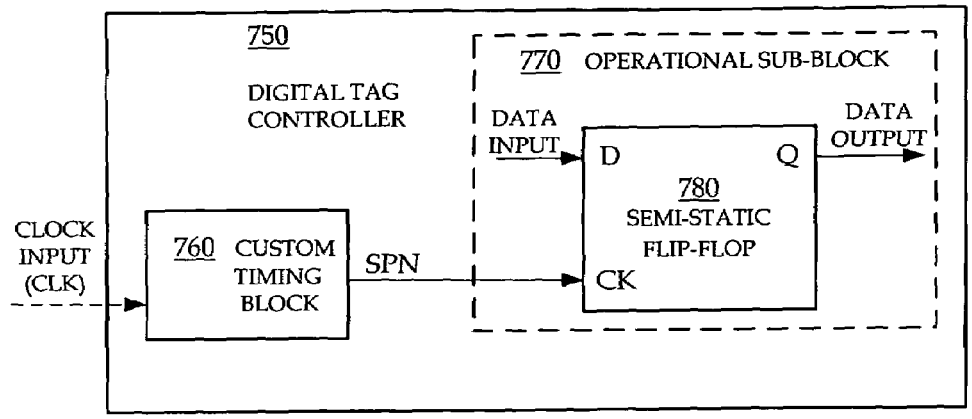
FIGS. 7A and 7B are block diagrams of a tag controller, and representations of controller waveforms, respectively, according to various embodiments of the invention.
Figure 7B:
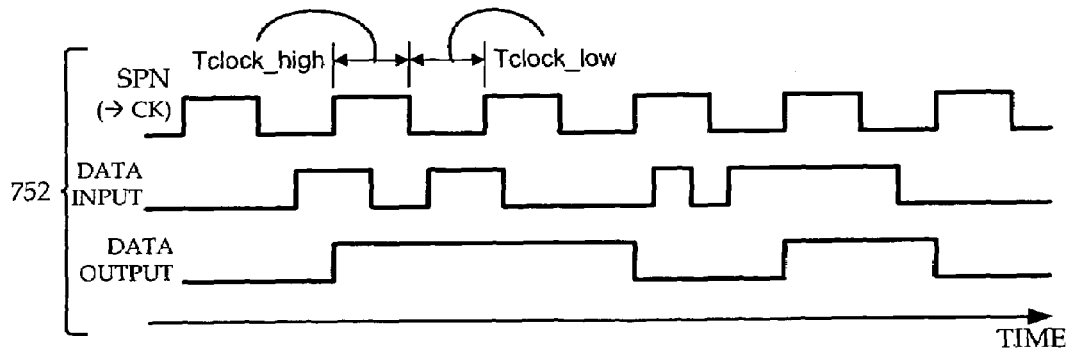

FIGS. 7A and 7B are block diagrams of a tag controller 750, and representations of controller waveforms 752, respectively, according to various embodiments of the invention. The tag controller 750 may be similar to or identical to the tag controller 450, shown in FIG. 4. Here it can be seen that the master clock signal CLK (provided by an oscillator, not shown) is transformed by the custom timing block 760 into the semi-static clock SPN for use with one or more operational sub-blocks 770 that may include, in turn, one or more semi-static flip-flops 780. As shown in this example, the data output follows the data input on the rising edge of the semi-static clock SPN. Thus, the active clock edge in this case is the rising clock edge. In some embodiments, the active clock edge is the falling clock edge.

Attention is drawn to a distinction between flip-flops 780 that are semi-static, as opposed to those that are dynamic or static (e.g., those that might be used in the prior art tag controller 650 shown in FIG. 6A). Semi-static flip-flops are also some times referred to as semi-dynamic flip-flops. Semi-static flip-flops store their logic state dynamically, that is as charge stored on one or more capacitors, during only one of the two clock states, during either Tclock_high or during Tclock_low, and store their logic state statically during the other clock state. The dynamic storage time of a semi-static flip-flop is the maximum time duration of the dynamic clock state. For semi-static flip-flops, the state of the semi-static clock SPN, either the time the clock SPN is high (e.g., Tclock_high) or the time the clock SPN is low (e.g., Tclock_low), but not both, is typically limited as to its maximum duration, corresponding to the dynamic storage time of the flip-flop. The other clock phase may be arbitrarily long, corresponding to the static storage time of the flip-flop. That is, if Tclock_high is limited, then Tclock_low may be arbitrarily long. Similarly, if Tclock_low is limited, then Tclock_high may be arbitrarily long. The area and power used by semi-static flip-flops may be higher than corresponding values for dynamic flip-flops, but lower than that associated with static flip-flops.

The distinction between semi-static flip-flops and static/dynamic flip-flops is known to those skilled in the art, and also pointed out in a paper entitled: "New Single-Clock CMOS Latches and Flipflops with Improved Speed and Power Savings", IEEE Journal of Solid-State Circuits, vol. 32, no. 1, January 1997, pp. 62-69, by Jiren Yuan and Christer Svensson. Some discussion of semi-static flip-flops can also be found in U.S. Pat. No. 4,227,097, incorporated herein by reference in its entirety.

Figure 8A:
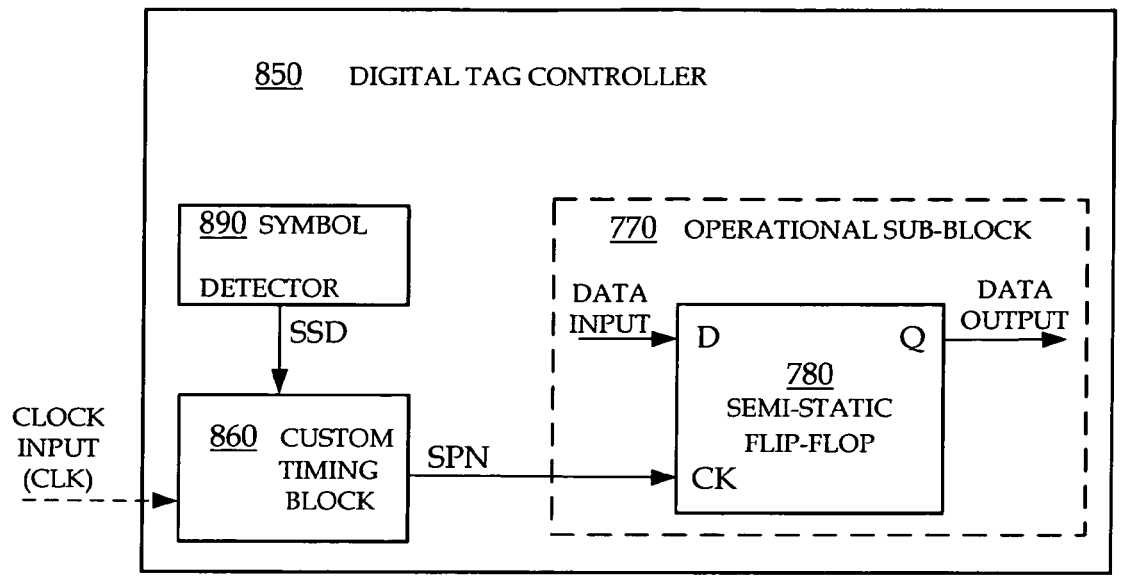
FIGS. 8A and 8B are block diagrams of a tag controller including a symbol detector, and representations of controller waveforms, respectively, according to various embodiments of the invention.
Figure 8B:
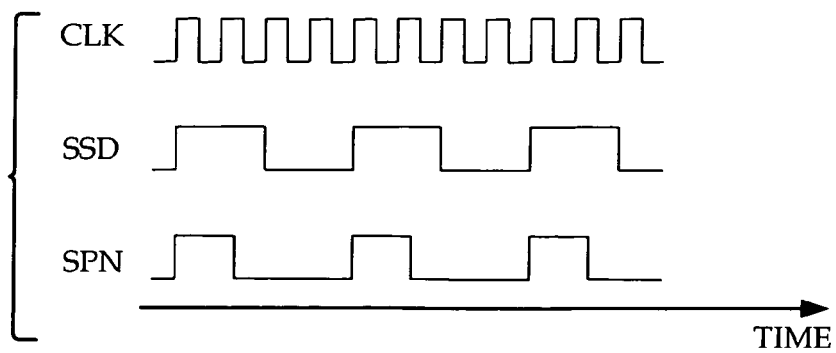

FIGS. 8A and 8B are block diagrams of a tag controller 850 including a symbol detector 890, and representations of controller waveforms 852, respectively, according to various embodiments of the invention. The tag controller 850 may be similar to or identical to the tag controller 450, shown in FIG. 4. In this example, symbol rate clocking, where each symbol represents approximately one bit of data, may be used. Since some protocols have non-data symbols (e.g., null or start/stop bits), the symbol rate is typically equal to or less than the data rate. Each symbol clock edge (either the rising edge or the falling edge) processes one bit of data. The symbol clock SSD may be derived from the forward link data processed by the tag controller 850. As will be shown below, multiple symbol clock phases may be used for different sub-blocks, and some sub-block clocks may still be operated at the frequency of the master clock CLK (or some other relatively high frequency provided by an oscillator, not shown) if desired.

Symbol rate clocking, where the symbol clock SSD is used to regulate the frequency of the semi-static clock SPN, may reduce power consumption when used in conjunction with semi-static flip-flops 780 used in operational sub-blocks 770. This may be more noticeable when using complementary metal-oxide semiconductor (CMOS) technology, where power consumption can be proportional to clock frequency. Generally, the symbol rate (and therefore the symbol rate clock SSD) is slower than the master clock CLK frequency. While the symbol rate clock frequency may be too slow for some dynamic flip-flops, it may still be used with static flip-flops, perhaps at a higher area cost.

Figure 9A:
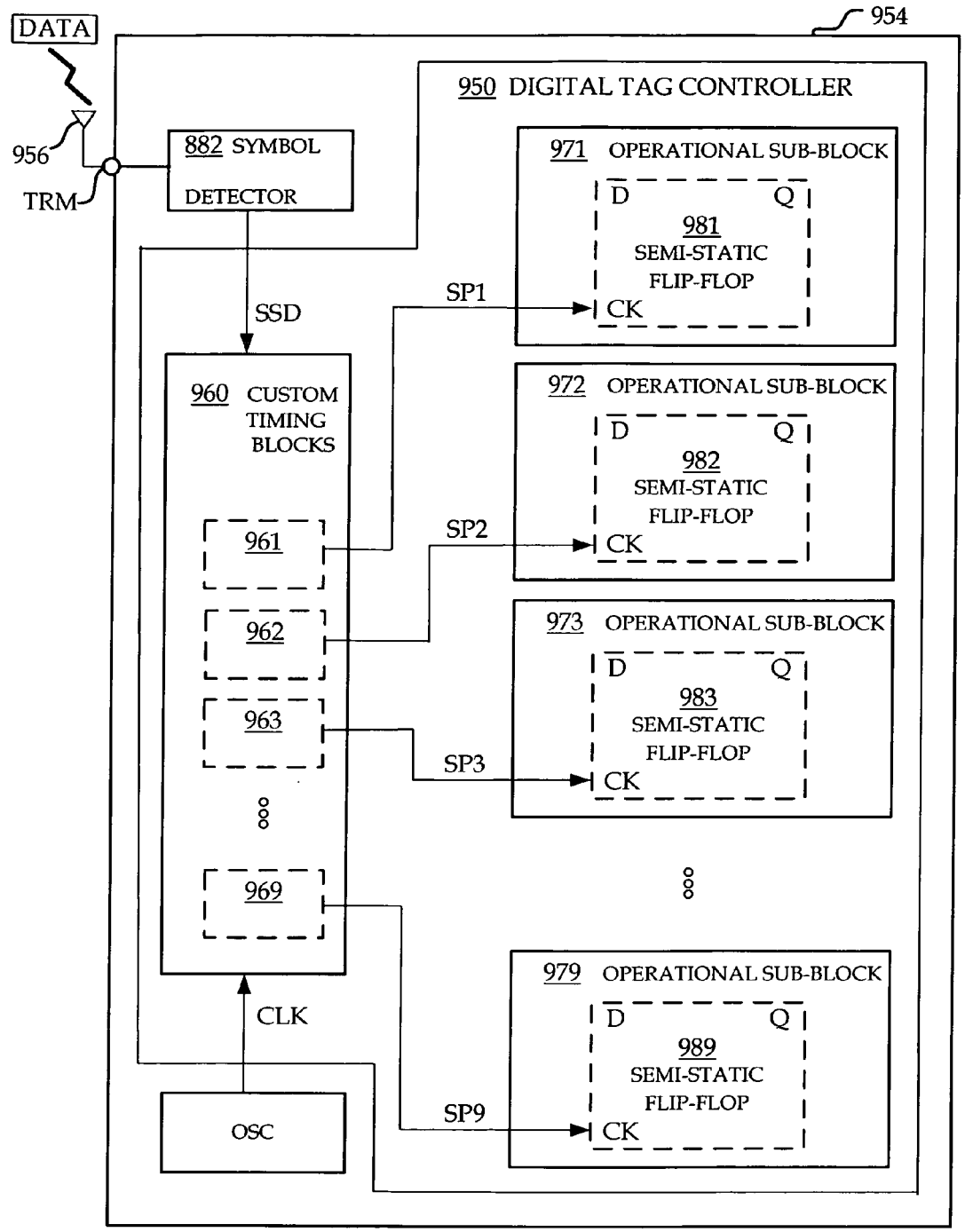
FIGS. 9A and 9B are block diagrams of a tag controller sub-block, and representations of sub-block waveforms, respectively, according to various embodiments of the invention.
Figure 9B:
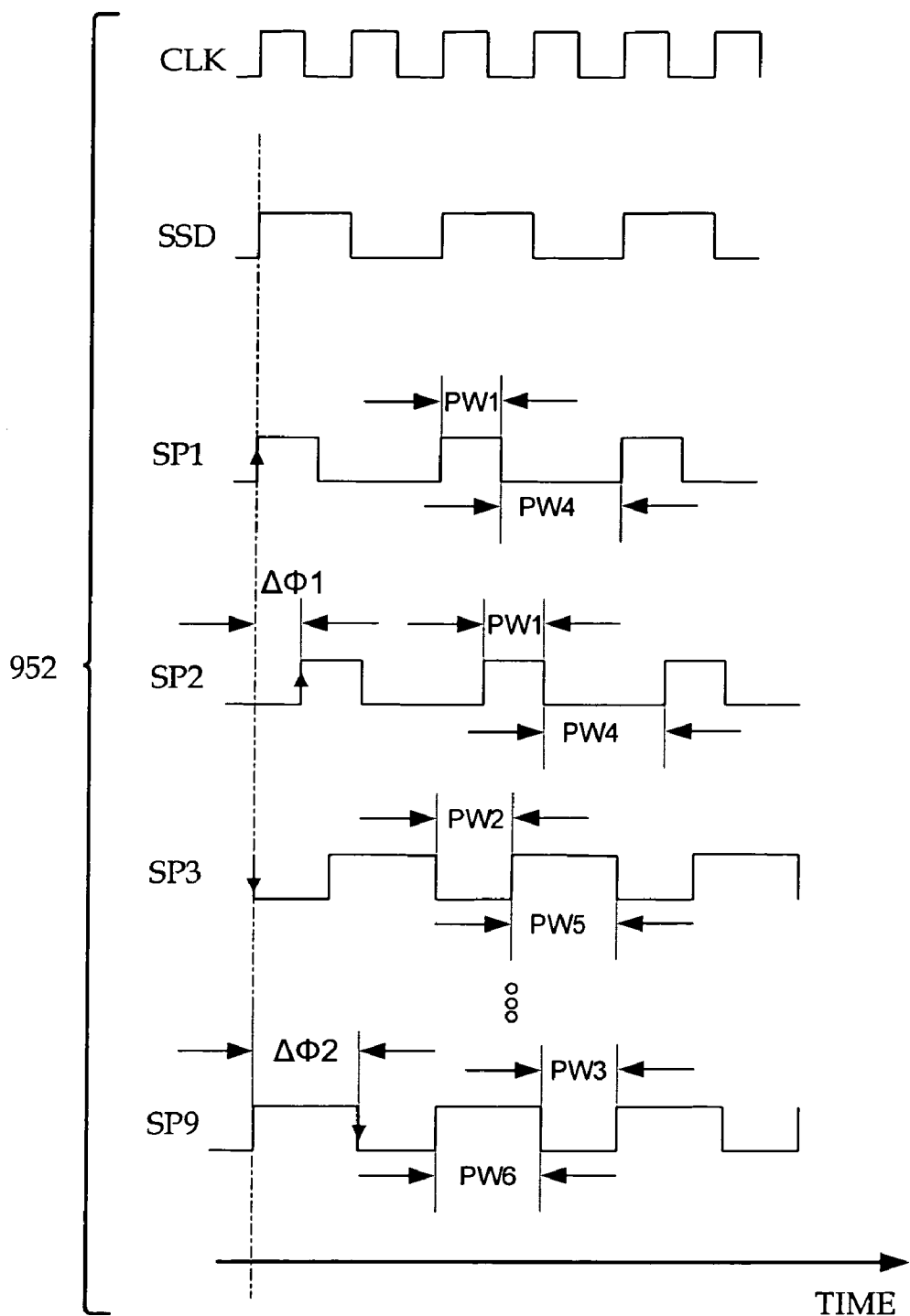

FIGS. 9A and 9B are block diagrams of a tag controller sub-block 950, and representations of sub-block waveforms 952, respectively, according to various embodiments of the invention. The tag controller 950 may be similar to or identical to the tag controller 450, shown in FIG. 4. Here, the concept of narrow pulse, symbol rate clocking is introduced.

In some embodiments, symbol rate clocking may be combined with narrow pulses (where the active clock edge defines a pulse with less than a 50% duty cycle). For example, the symbol detector 882 in the tag controller 950 may provide the basis for a series of semi-static clocks SP1, SP2, SP3, ..., SP9 that drive one or more operational sub-blocks 971, 972, 973, ..., 979, each of which, in turn, may have one or more semi-static flip-flops 981, 982, 983, ..., 989. The operational sub-blocks 971, 972, 973, . . . , 979 may include a number of circuits, such as a symbol encoder, a symbol decoder, a state machine, and a memory interface, among others. Such circuits, known to those of ordinary skill in the art, may be included in a single sub-block, or be divided among a number of sub-blocks.

The semi-static clocks SP1, SP2, SP3, . . . , SP9 may be provided by a single custom timing block 960, or a corresponding series of custom timing blocks 961, 962, 963, . . . , 969. As seen in FIG. 9B, the pulse width of the semi-static clocks SP1, SP2, SP3, . . . , SP9 may be the same as one period of high frequency master clock CLK provided by the oscillator OSC. Of course, other pulse widths (wider or narrower) are possible. For the purposes of this document, "pulse width" can be taken to mean the time interval between the first and last instants at which the instantaneous amplitude reaches 50% of the peak pulse amplitude. (From McGraw-Hill Dictionary of Scientific and Technical Terms, 5th Edition, Sybil P. Parker, editor, McGraw-Hill, New York, 1994).

The use of a narrow pulse enables the operation of semi-static flip-flops, which can have relatively short clock state timing for a first clock state, and arbitrarily long clock state timing for a second clock state. Thus, using a lower frequency clock (e.g., of semi-static clocks SP1, SP2, SP3, . . . , SP9) in conjunction with semi-static flip flops may provide lower power consumption than that of static flip-flops, with an area almost as low as that associated with dynamic flip-flops.

The pulse widths PW1 of the semi-static clocks SP1, SP2 may be the same, or different (e.g., consider the different pulse widths PW1 and PW3, associated with semi-static clocks SP2 and SP9). Similarly, the phase difference between the semi-static clocks SP1, SP3 may be the same, or different (e.g., consider the phase difference between semi-static clock SP1 and SP2, $\Delta\phi 1$, and the phase difference between semi-static clock SP3 and SP9, $\Delta\phi 2$). Active clock edges may also be the same or different, such as an active edge being the rising edge for semi-static clocks SP1, SP2, and the active edge being the falling edge for semi-static clocks SP3, SP9.

Thus, many embodiments may be realized. For example, an RFID circuit 954 (which may be similar to or identical to the circuit 430 of FIG. 4) may include one or more semi-static flip-flops 981, 982, 983, . . . , 989 having a dynamic storage time and a static storage time, with the static storage time longer than the dynamic storage time. The RFID circuit 954 may also include one or more timing block circuits 960, 961, 962, 963, . . . , 969 operable to provide timing block clock signals SP1, SP2, SP3, . . . , SP9 to the semi-static flip-flops 981, 982, 983, . . . , 989. The timing block clock signals SP1, SP2, SP3, . . . , SP9 may have a first clock state duration PW1, PW2, PW3 shorter than the dynamic storage time, and a second clock state PW4, PW5, PW6 duration longer than the dynamic storage time.

In some embodiments, the RFID circuit 954 may include an oscillator OSC operable to provide a high-frequency clock CLK having a frequency higher than a frequency of the timing block clock signals SP1, SP2, SP3, . . . , SP9, in which the timing block clock signals SP1, SP2, SP3, . . . , SP9 are derived from the high-frequency clock CLK. The RFID circuit 954 may also include one or more antenna terminals TRM (which may be similar to or identical to antenna connections 432, 433 of FIG. 4) operable to receive forward link data DATA.

The operational sub-blocks 971, 972, 973, . . . , 979 may be operable to process the forward link data DATA, such that one or more semi-static flip-flops 981, 982, 983, . . . , 989 included in the sub-blocks 971, 972, 973, . . . , 979 may be operable to control the flow of the forward link data DATA through the respective sub-blocks 971, 972, 973, . . . , 979. As noted previously, the operational sub-blocks 971, 972, 973, . . . , 979 may comprise one or more symbol encoders, symbol decoders, state machines, and/or memory interfaces, etc.

Thus, in some embodiments, the timing block clock signals SP1, SP2, SP3, . . . , SP9 may be derived from forward link data DATA, from symbols included in the forward link data DATA, and/or from express timing instructions included in the forward link data DATA.

When multiple timing block circuits are used to provide separate timing block clock signals to different operational sub-blocks, the same forward link data DATA may be used to provide the separate timing block clock signals. As noted previously, the clock state durations of the separate timing block clock signals may be the same, or different. And the phases of the separate timing block clock signals may also be the same, or different. That is, any combination of clock state durations and phases may be realized.

Still further embodiments may be realized. For example, an RFID tag may include an antenna 956 (perhaps comprising segments similar to or identical to the segments 227 of FIG. 2) operable to receive a wireless signal DATA having encoded symbols. The RFID tag may include a symbol detector 882 operable to detect the encoded symbols of the wireless signal DATA, and one or more semi-static flip-flops 981, 982, 983, . . . , 989, as described previously, to couple to the symbol detector 882.

Many embodiments of the invention include methods. Some are methods of operation of an RFID reader or an RFID reader system. Others are methods for controlling an RFID reader or an RFID reader system.

Figure 10:
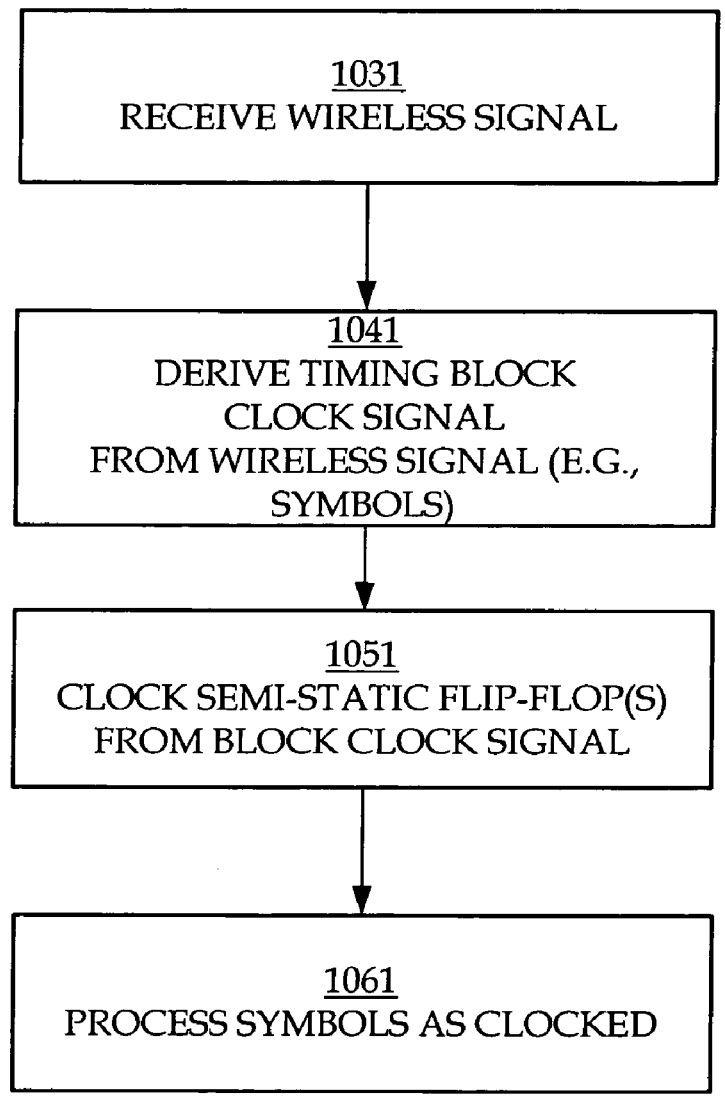
FIG. 10 is a flow diagram illustrating several methods, according to various embodiments of the invention.

For example, FIG. 10 is a flow diagram illustrating several methods 1011, according to various embodiments of the invention. In some embodiments, a method 1011 may include receiving a wireless signal at an RFID circuit at block 1031.

The method 1011 may continue with deriving a timing block clock signal from the wireless signal at block 1041. For example, deriving the timing block clock signals (which may have less than a 50% duty cycle) can include detecting encoded symbols in the wireless signal, and deriving the timing block clock signal from a frequency associated with the encoded symbols. Deriving the timing block clock signal may also include deriving the timing block clock signal from a period of a high-frequency clock having a frequency higher than a frequency of the timing block clock signal and/or deriving the timing block clock signal from forward link data.

The method 1011 may include, at block 1051, clocking one or more semi-static flip-flops included in the RFID circuit with one or more timing block clock signals. As noted previously, the timing block clock signal(s) may have a first clock state duration shorter than a dynamic storage time of the semi-static flip-flops, and a second clock state duration longer than the dynamic storage time, where the static storage times of the semi-static flip-flops are longer then the dynamic storage times.

The method 1011 may conclude with processing the symbols as they are clocked at block 1061. For example, the method 1011 may include controlling the flow of the encoded symbols through one or more operational sub-blocks using the semi-static flip-flops included in the sub-blocks.

Considering the apparatus, systems, and methods previously described, still further embodiments may be realized. For example, an apparatus may include means for receiving a wireless signal at an RFID circuit. The apparatus may also include means for clocking a semi-static flip-flop included in the RFID circuit with a timing block clock signal having a first clock state duration shorter than a dynamic storage time of the semi-static flip-flop, and a second clock state duration longer than the dynamic storage time, wherein the static storage time of the semi-static flip-flop is longer then the dynamic storage time.

It should be noted that the methods described herein can be implemented in any number of ways, including via the structures described in this document. One such way is by machine operations, using devices of the type described in this document. Another optional way is for one or more of the individual operations of the methods to be performed in conjunction with one or more human operators performing others. These human operators need not be collocated with each other, but each may be located separately, along with one or more machines that perform a portion of the operations described.

In addition, it should be noted that the methods described herein do not have to be executed in the order described, or in any particular order. Moreover, various activities described with respect to the methods identified herein can be executed in iterative, repetitive, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment.

Thus, other embodiments may be realized. For example, an article of manufacture according to various embodiments, such as a computer, a memory system, a magnetic or optical disk, some other storage device, an RFID reader, and/or any type of electronic device or system may include a processor coupled to a machine-accessible medium such as a memory (e.g., removable storage media, as well as any memory including an electrical, optical, or electromagnetic conductor) having associated information (e.g., computer program instructions and/or data), which when accessed, results in a machine (e.g., the processor) performing any of the actions described with respect to the methods above.

Using the circuits and methods disclosed herein may provide significant die area (e.g., wafer cost) savings, since semi-static flip-flops are roughly 40% smaller than static flip-flops. Power may also be saved with respect to using dynamic flip-flops, perhaps increasing the range of RFID circuit operation.

The accompanying drawings that form a part hereof, show by way of illustration, and not of limitation, specific embodiments in which the subject matter may be practiced. The architecture of the system is presented for purposes of explanation, and not of limitation. Its particular subdivision into modules need not be followed for creating embodiments according to the invention. Furthermore, the features of the invention can be performed either within a single one of the modules, or by a combination of them. An economy is achieved by using a single set of flowcharts to describe methods in and of themselves, along with operations of hardware and/or software. This is regardless of how each element is implemented.

The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

In this description, numerous specific details such as logic implementations, opcodes, means to specify operands, resource partitioning, sharing, and duplication implementations, types and interrelationships of system components, and logic partitioning/integration choices are set forth in order to provide a more thorough understanding of various embodiments. It will be appreciated, however, by those skilled in the art that embodiments of the invention may be practiced without such specific details. In other instances, control structures, gate level circuits, and full software instruction sequences have not been shown in detail so as not to obscure the embodiments of the invention.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A radio frequency identification (RFID) circuit, including:
    a first semi-static flip-flop having a first dynamic storage time and a first static storage time longer than the first dynamic storage time; and
    a first timing block circuit operable to provide a first timing block clock signal to the first semi-static flip-flop, the first timing block clock signal having a first clock state duration shorter than the first dynamic storage time and a second clock state duration longer than the first dynamic storage time.

2. The circuit of claim 1, further including:
an oscillator operable to provide a high-frequency clock having a frequency higher than a frequency of the timing block clock signal, in which the timing block clock signal is derived from the high-frequency clock.

3. The circuit of claim 1, further including:
an antenna terminal operable to receive forward link data; and
a first operational sub-block operable to process the forward link data, wherein the first semi-static flip-flop is operable to control the flow of the forward link data through the first operational sub-block.

4. The circuit of claim 3, wherein the first operational sub-block comprises at least one of a symbol encoder and a symbol decoder.

5. The circuit of claim 3, wherein the first operational sub-block comprises a state machine.

6. The circuit of claim 3, wherein the first operational sub-block comprises a memory interface.

7. The circuit of claim 3, wherein the timing block clock signal is derived from forward link data.

8. The circuit of claim 7, wherein the timing block clock signal is derived from an express timing instruction included in the forward link data.

9. The circuit of claim 7, wherein the timing block clock signal is derived from symbols included in the forward link data.

10. The circuit of claim 3, further including:
a second semi-static flip-flop;
a second timing block circuit operable to provide a second timing block clock signal to the second semi-static flip-flop; and
a second operational sub-block to process a portion of the forward link data, wherein the second semi-static flip-flop controls the flow of the portion of the forward link data through the second operational sub-block.

11. The circuit of claim 10, wherein a first clock state duration of the second timing block clock signal is substantially the same as the first clock state duration of the timing block clock signal, and wherein a phase of the second timing block clock signal is not the same as a phase of the first timing block clock signal.

12. The circuit of claim 10, wherein a phase of the second timing block clock signal is substantially the same as a phase of the first timing block clock signal, and wherein a first clock state duration of the second timing block clock signal is not the same as the first clock state duration of the first timing block clock signal.

13. The circuit of claim 10, wherein a first clock state duration of the second timing block clock signal is not the same as the first clock state duration of the first timing block clock signal, and wherein a phase of the second timing block clock signal is not the same as a phase of the first timing block clock signal.

14. A radio frequency identification (RFID) tag, including:
an antenna operable to receive a wireless signal having encoded symbols;
a symbol detector operable to detect the encoded symbols of the wireless signal;
a first semi-static flip-flop to couple to the symbol detector and having a first dynamic storage time and a first static storage time longer than the first dynamic storage time; and
a first timing block circuit operable to provide a first timing block clock signal to the first semi-static flip-flop, the first timing block clock signal having a first clock state duration shorter than the first dynamic storage time and a second clock state duration longer than the first dynamic storage time.

15. The RFID tag of claim 14, further including:
an oscillator operable to provide a high-frequency clock having a frequency higher than a frequency of the timing block clock signal, in which the timing block clock signal is derived from the high-frequency clock.

16. The RFID tag of claim 14, further including:
an antenna terminal operable to receive forward link data; and
a first operational sub-block operable to process the forward link data, wherein the first semi-static flip-flop is operable to control the flow of the forward link data through the first operational sub-block.

17. The RFID tag of claim 16, wherein the first operational sub-block comprises at least one of a symbol encoder and a symbol decoder.

18. The RFID tag of claim 16, wherein the first operational sub-block comprises a state machine.

19. The RFID tag of claim 16, wherein the first operational sub-block comprises a memory interface.

20. The RFID tag of claim 16, further including:
a second semi-static flip-flop;
a second timing block circuit operable to provide a second timing block clock signal to the second semi-static flip-flop; and
a second operational sub-block to process a portion of the forward link data, wherein the second semi-static flip-flop controls the flow of the portion of the forward link data through the second operational sub-block.

21. The RFID tag of claim 20, wherein a first clock state duration of the second timing block clock signal is substantially the same as the first clock state duration of the timing block clock signal, and wherein a phase of the second timing block clock signal is not the same as a phase of the first timing block clock signal.

22. The RFID tag of claim 20, wherein a phase of the second timing block clock signal is substantially the same as a phase of the first timing block clock signal, and wherein a first clock state duration of the second timing block clock signal is not the same as the first clock state duration of the first timing block clock signal.

23. The RFID tag of claim 20, wherein a first clock state duration of the second timing block clock signal is not the same as the first clock state duration of the first timing block clock signal, and wherein a phase of the second timing block clock signal is not the same as a phase of the first timing block clock signal.

24. A method, including:
receiving a wireless signal at a radio frequency identification circuit; and
clocking a semi-static flip-flop included in the radio frequency identification circuit with a timing block clock signal having a first clock state duration shorter than a first dynamic storage time of the semi-static flip-flop and a second clock state duration longer than the first dynamic storage time, wherein a first static storage time of the semi-static flip-flop is longer then the first dynamic storage time.

25. The method of claim 24, further including:
detecting encoded symbols in the wireless signal; and
deriving the timing block clock signal from a frequency associated with the encoded symbols.

26. The method of claim 25, further including:
controlling the flow of the encoded symbols through an operational sub-block using the semi-static flip-flop.

27. The method of claim 24, further including:
deriving the timing block clock signal from a period of a high-frequency clock having a frequency higher than a frequency of the timing block clock signal.

28. The method of claim 24, further including:
deriving the timing block clock signal from forward link data.

29. The method of claim 24, in which the timing block clock signal has less than a 50% duty cycle.

30. An apparatus, including:
means for receiving a wireless signal at a radio frequency identification circuit; and
means for clocking a semi-static flip-flop included in the radio frequency identification circuit with a timing block clock signal having a first clock state duration shorter than a first dynamic storage time of the semi-static flip-flop and a second clock state duration longer than the first dynamic storage time, wherein a first static storage time of the semi-static flip-flop is longer then the first dynamic storage time.

* * * * *

UNITED STATES PATENT AND TRADEMARK OFFICE
CERTIFICATE OF CORRECTION

PATENT NO. : 7,541,843 B1  Page 1 of 1
APPLICATION NO. : 11/490671
DATED : June 2, 2009
INVENTOR(S) : Hyde et al.

It is certified that error appears in the above-identified patent and that said Letters Patent is hereby corrected as shown below:

1) Please delete "RELATED APPLICATIONS" in column 1, line 7 of the specification, and insert --RELATED APPLICATIONS-- in column 1, line 2 of the specification.

2) Please delete "EPCu" in column 4, line 40 of the specification, and insert --EPC--, therefor.

3) Please delete "then" in column 10, line 54 of the specification, and insert --than--, therefor.

4) Please delete "then" in column 11, line 3 of the specification, and insert --than--, therefor.

5) Please delete "then" in claim 24, column 14, line 62 and insert --than--, therefor.

6) Please delete "then" in claim 30, column 16, line 10 and insert --than--, therefor.

Signed and Sealed this

Seventeenth Day of November, 2009

David J. Kappos
*Director of the United States Patent and Trademark Office*